(12) United States Patent
Mayer et al.

(10) Patent No.: US 6,729,181 B2
(45) Date of Patent: May 4, 2004

(54) FLOW SENSOR IN A HOUSING

(75) Inventors: Felix Mayer, Zürich (CH); Mark R. Hornung, Zürich (CH)

(73) Assignee: Sensiron AG, Zurich (CH)

( * ) Notice: Subject to any disclaimer, the term of this patent is extended or adjusted under 35 U.S.C. 154(b) by 0 days.

(21) Appl. No.: 09/931,511

(22) Filed: Aug. 16, 2001

(65) Prior Publication Data

US 2002/0043710 A1 Apr. 18, 2002

(30) Foreign Application Priority Data

Aug. 23, 2000 (CH) .................................. 1644/00

(51) Int. Cl.[7] .................................. G01F 1/68
(52) U.S. Cl. .................................. 73/204.22
(58) Field of Search .................. 73/202, 204.15, 73/204.16, 204.22, 204.26

(56) References Cited

U.S. PATENT DOCUMENTS

| | | | | |
|---|---|---|---|---|
| 4,548,078 A | * | 10/1985 | Bohrer et al. | 73/204.22 |
| 4,672,997 A | * | 6/1987 | Landis et al. | 137/554 |
| 4,677,850 A | * | 7/1987 | Miura et al. | 73/204.15 |
| 4,829,818 A | * | 5/1989 | Bohrer | 73/204.22 |
| 5,396,795 A | * | 3/1995 | Araki | 73/204.26 |
| 5,404,753 A | | 4/1995 | Hecht et al. | 73/204.22 |
| 6,030,709 A | | 2/2000 | Jensen et al. | 428/446 |
| 6,085,596 A | * | 7/2000 | Jensen et al. | 73/754 |
| 6,176,131 B1 | * | 1/2001 | Hecht et al. | 73/204.26 |
| 6,452,414 B1 | * | 9/2002 | Lorenz | 324/158.1 |
| 6,591,674 B2 | * | 7/2003 | Gehman et al. | 73/204.22 |

FOREIGN PATENT DOCUMENTS

| | | | |
|---|---|---|---|
| DE | 4219454 | 12/1993 | G01F/1/68 |
| DE | 19614459 | 10/1997 | H01L/23/29 |
| EP | 0172669 | 2/1986 | G01F/1/68 |

* cited by examiner

Primary Examiner—Harshad Patel
(74) Attorney, Agent, or Firm—Cooper & Dunham LLP; Donald S. Dowden

(57) ABSTRACT

The flow sensor has a first and a second housing section and a semiconductor chip with an integrated sensor element between the housing sections. The semiconductor chip is arranged at a measuring conduit formed by a groove in a first one of the housing sections. A sealing ring is arranged between the housing sections. A flexible support foil carrying strip conductors is connected to the semiconductor chip and extends between the sealing ring and the second housing section out of the housing. This simple arrangement is able to withstand high pressure.

20 Claims, 4 Drawing Sheets

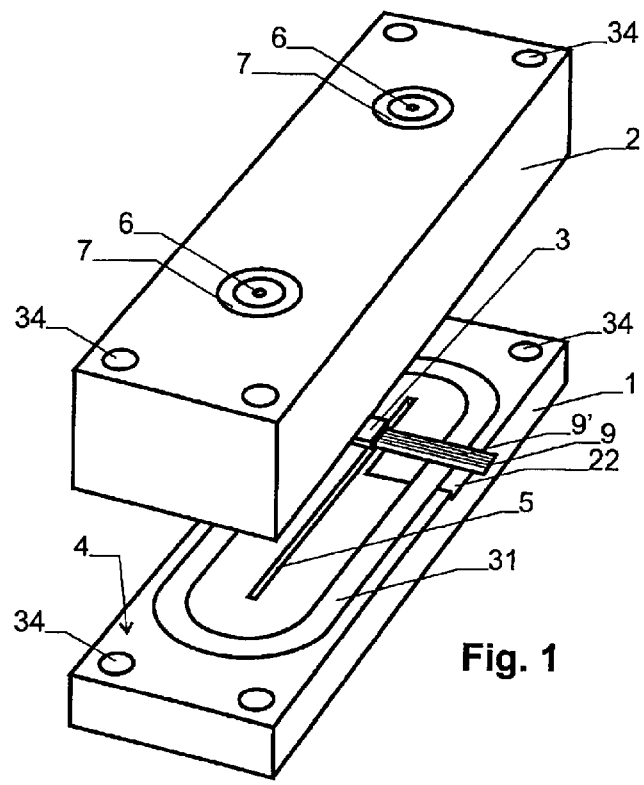
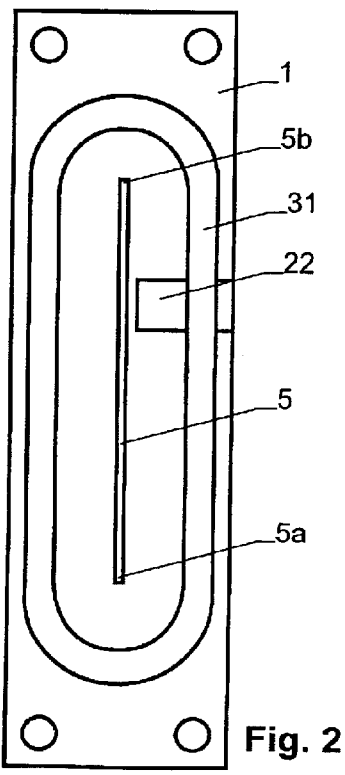
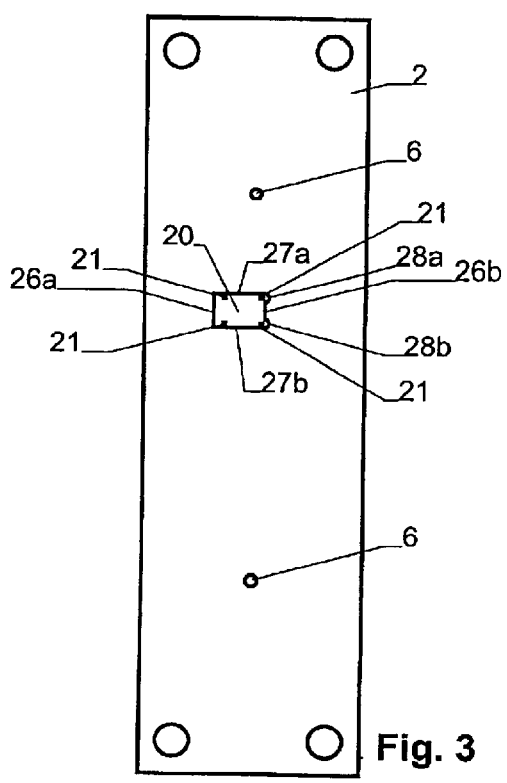

FLOW SENSOR IN A HOUSING

CROSS REFERENCE TO RELATED APPLICATIONS

This application claims the priority of Swiss patent application 1644/00, filed Aug. 23, 2000, the disclosure of which is incorporated herein by reference in its entirety.

BACKGROUND OF THE INVENTION

The invention relates to a flow sensor having a housing and a semiconductor chip with integrated sensor.

A known flow sensor of this type comprises a two part housing forming a measuring conduit. A semiconductor chip with a sensor is arranged at a wall of the measuring conduit. For sealing the conduit, the semiconductor chip is clamped between the housing sections.

This known solution has, however, the disadvantage that it is not suited for applications where there is a high static or dynamic pressure in the measuring conduit.

BRIEF SUMMARY OF THE INVENTION

Hence, it is a general object of the invention to provide a flow sensor with a housing which is able to withstand high pressure.

Now, in order to implement these and still further objects of the invention, which will become more readily apparent as the description proceeds, the flow sensor is manifested by the features that it comprises a housing with at least two housing sections and forming a measuring conduit between at least some of said housing sections, a semiconductor chip comprising a sensor arranged at a wall of the measuring conduit, a sealing ring arranged between two housing sections and surrounding said semiconductor chip, said sealing ring pressing against a support formed by at least one of said housing sections, and at least one strip conductor connected to the semiconductor chip and extending between said support and said sealing ring and out of said housing.

In such an arrangement, the semiconductor chip has no sealing function but is completely arranged in the area enclosed by the sealing ring. For connecting the semiconductor chip, one or more strip conductors are lead out of the housing, passing between the support and the sealing ring. Such a device can be assembled easily.

Preferably, the at least one strip conductor is arranged on a flexible support foil. It is, however, also possible to arrange the strip conductor on one of the housing sections.

Preferably, the measuring conduit is formed by a groove in the surface of a first housing section. For connecting the groove, connecting ducts can be provided, e.g. in the form of bores or holes, which extend through one or several housing section(s). The sealing ring can be arranged around the groove. This arrangement allows to seal the conduit from all sides.

Preferably, the semiconductor chip is arranged in a recess of the second housing section and its top surface (i.e. the side with the sensor) is flush with the wall of the measuring conduit in order to favour laminar flow within the conduit. For exactly positioning the top surface of the semiconductor chip, it is in contact with the first housing section. Preferably, a spacer is arranged at the bottom of the recess, which spacer is deformed by the force exerted by the first housing section on the semiconductor chip. In this way, an accurate alignment of the sensor element with the measuring conduit is guaranteed when the device is assembled. The spacer can e.g. be formed by small bumps at the bottom of the recess.

The flow sensor according to the present invention is suited for measuring the flow of fluids at normal and elevated pressure.

BRIEF DESCRIPTION OF THE DRAWINGS

The invention will be better understood and objects other than those set forth above will become apparent when consideration is given to the following detailed description thereof. Such description makes reference to the annexed drawings, wherein:

FIG. 1 is an exploded view of a first embodiment of the flow sensor,

FIG. 2 is the first housing section as seen from the second housing section,

FIG. 3 is the second housing section as seen from the first housing section,

DETAILED DESCRIPTION OF THE INVENTION

Figure 4:
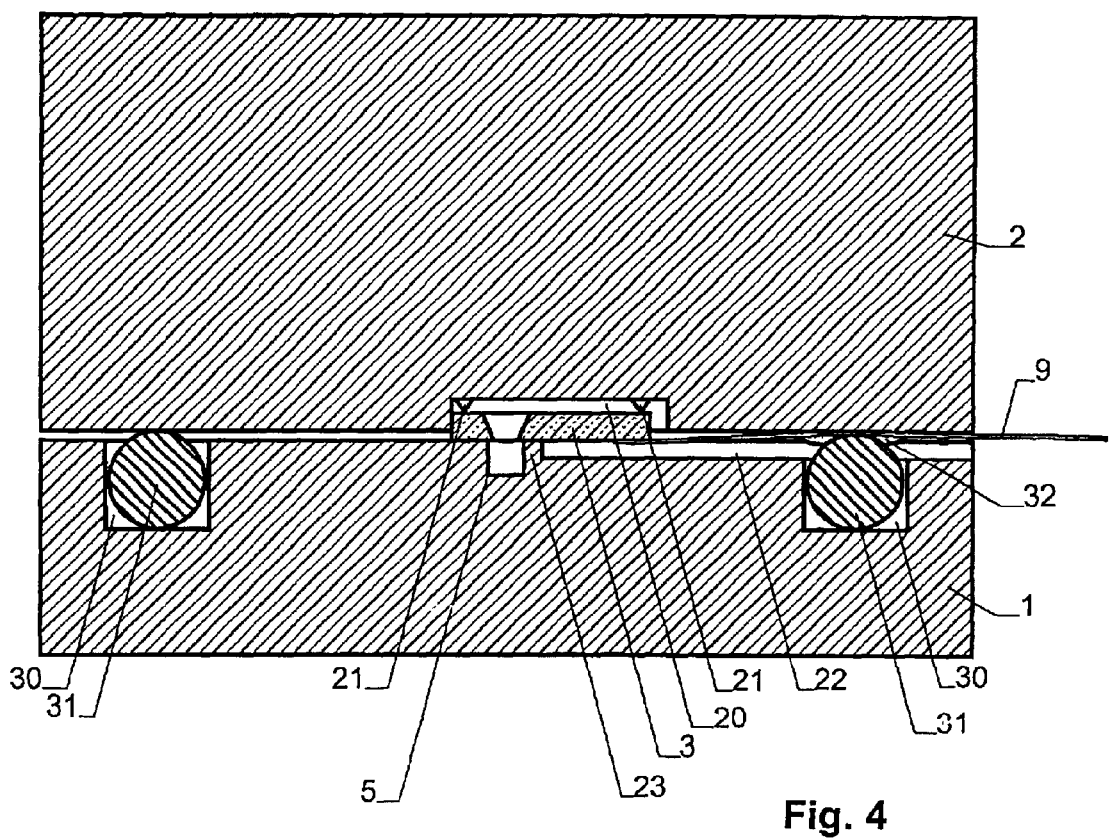
FIG. 4 is a sectional view perpendicular to the measuring conduit through the flow sensor and the semiconductor chip.

The flow sensor shown in the figures comprises a first housing section 1, a second housing section 2 and a semiconductor chip 3 held between the housing sections 1, 2. FIG. 1 shows these parts at a distance from each other—in the assembled device, the housing sections 1, 2 are adjacent and semiconductor chip 3 is clamped between them.

A straight groove 5 is arranged in a surface 4 of first housing section 1. Groove 5 forms, together with adjacent second housing section 2, a measuring conduit. Two connecting ducts 6, in the forms of bores or openings, extend though second housing section 2 and communicate with the ends 5a, 5b of the measuring conduit. At the outer side of second housing section 2 the mouths of the connecting ducts 6 are surrounded by sealings 7 such that they can e.g. be connected with a tube carrying the fluid to be measured.

Figure 5:
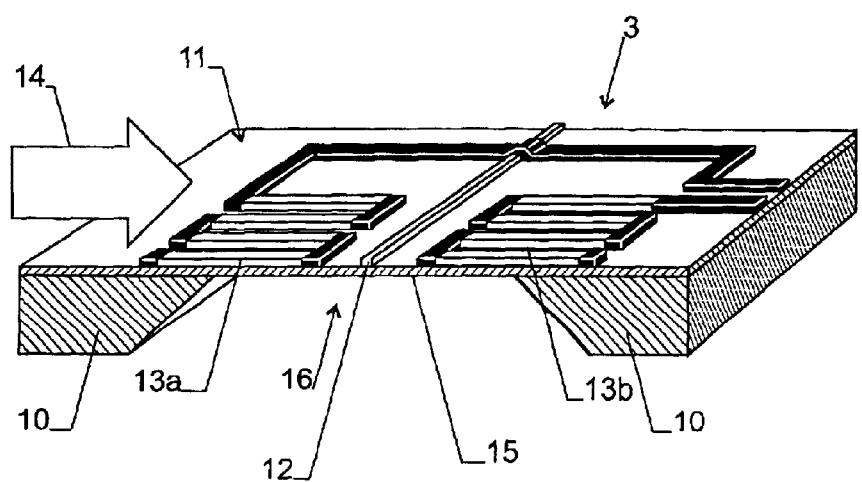
FIG. 5 is a partial section of a possible embodiment of the semiconductor chip.

A possible set-up of semiconductor chip 3 is shown in FIG. 5. It comprises a semiconductor substrate 10 with a sensor element integrated on its top side 11. The sensor element has a conventional design with a heater 12 arranged between two temperature sensors 13a, 13b. The temperature sensors 13a, 13b are, when seen along the flow direction of the fluid to be measured, in front of and after heater 12, such that their temperature difference depends on the flow velocity or mass flow of the fluid.

The sensor element is located on a membrane 15, which extends over an opening 16 extending through substrate 10.

As can best be seen from FIGS. 3 and 4, semiconductor chip 3 of a first embodiment of the invention is located in a recess 20 of the otherwise flat inner surface of second housing section 2, wherein the sensor element is facing the measuring conduit. Semiconductor chip 3 is connected to a flexible support foil 9 carrying strip conductors 9' and extending out of the flow sensor's housing. For this purpose, a recess 22 is provided in second housing section 2. Support foil 9 is e.g. a thin plastic foil having a total thickness of preferably less than 100 μm, including the strip conductors 9'. The strip conductors are flat in order to avoid an excessive deformation of the sealing ring mentioned below.

A nose 23 is arranged between recess 22 and groove 5 and rests against semiconductor chip 3. Four pyramidal bumps 21 are located at the bottom of recess 20. Second housing section 2 presses semiconductor chip 3 against the bumps 21, thereby deforming the tips of the bumps and guaranteeing that semiconductor chip 3 is flush with the wall of the measuring conduit.

The bumps 21 are preferably an integral part of second housing section 2. They do not have to be pyramidal, but they should taper to a tip in undeformed state such that the tips can be deformed easily. They can be deformed in elastic or plastic manner.

Recess 20 has two lateral walls 26a, 26b parallel to the measuring conduit and two end walls 27a, 27b perpendicular to the measuring conduit. One of the lateral walls, 26a, ends in recessed sections 28a, 28b and extends straight therebetween for forming a well defined stop, which allows to position semiconductor chip 3 in exact manner perpendicular to the measuring conduit. Without the recessed sections 28a, 28b the corners between wall 26a and walls 27a,b would be slightly rounded and semiconductor chip 3 would abut against these corners in an undefined manner.

Recess 20 is dimensioned such that gaps remain between end walls 27a, 27b and semiconductor chip 3 such that the area between semiconductor chip 3 and the bottom of recess 20 are communicating with the measuring conduit. This ensures that both sides of membrane 15 are in contact with the measuring conduit, such that the pressure drop over membrane 15 is substantially zero. This prevents membrane 15 from being damaged by high static or dynamic pressure peaks.

As can be seen from FIGS. 1, 2 and 4, a recess 30 in first housing section 1 having the shape of an elongate circle extends around groove 5. A sealing ring 31 in inserted in recess 30. When the device is assembled, sealing ring 31 is pressed against the inner side of second housing section 2, thereby sealing the measuring duct in the gap between the housing sections 1, 2.

Since second housing section 2 absorbs the force generated by sealing ring 31, it is designated to be the support of the device.

Support foil 9 with the strip conductors 9' is led from semiconductor chip 3 between sealing ring 31 and the inner side of second hosing section 2. It is in contact with sealing ring 31. For better sealing action, a sealant paste 32, such as silicone, can be arranged between support foil 9 and sealing ring 31.

As can be seen from FIG. 2, semiconductor chip 3 is not arranged in the center of groove 5. Rather, it is located closer to exit end 5b than to entry end 5a. Since the fluid to be measured flows from entry end 5a to exit end 5b, the asymmetric arrangement of semiconductor chip 3 closer to exit end 5b leads to are more laminar flow at the point of measurement.

The housing sections 1, 2 are preferably fabricated by mould injection techniques. Then, sealing ring 31 is positioned in recess 30 and semiconductor chip 3 is inserted in recess 20. Sealing paste 32 is applied over strip conductor 9. Finally, the housing sections 1, 2 are stacked on each other and connected by means of screws inserted into holes 34.

The housing sections 1, 2 can be made from plastic and/or metal. In particular for high pressure, the housing can also be an assembly of metal and plastic, the metal providing the required stability and the plastic being provided at the inner surfaces where good sealing and deformation properties are desired. In particular, sealing ring 31 can also be a sealing rib injection moulded directly into one of the housing sections.

In the present embodiment, the connecting ducts 6 are located in second housing section 2. One or both of them can, however, also be located in first housing section 1. Furthermore, sealing ring 31 can also be mounted in second housing section 2, or there could be a sealing ring in each of the housing sections 1 and 2.

Figure 6:
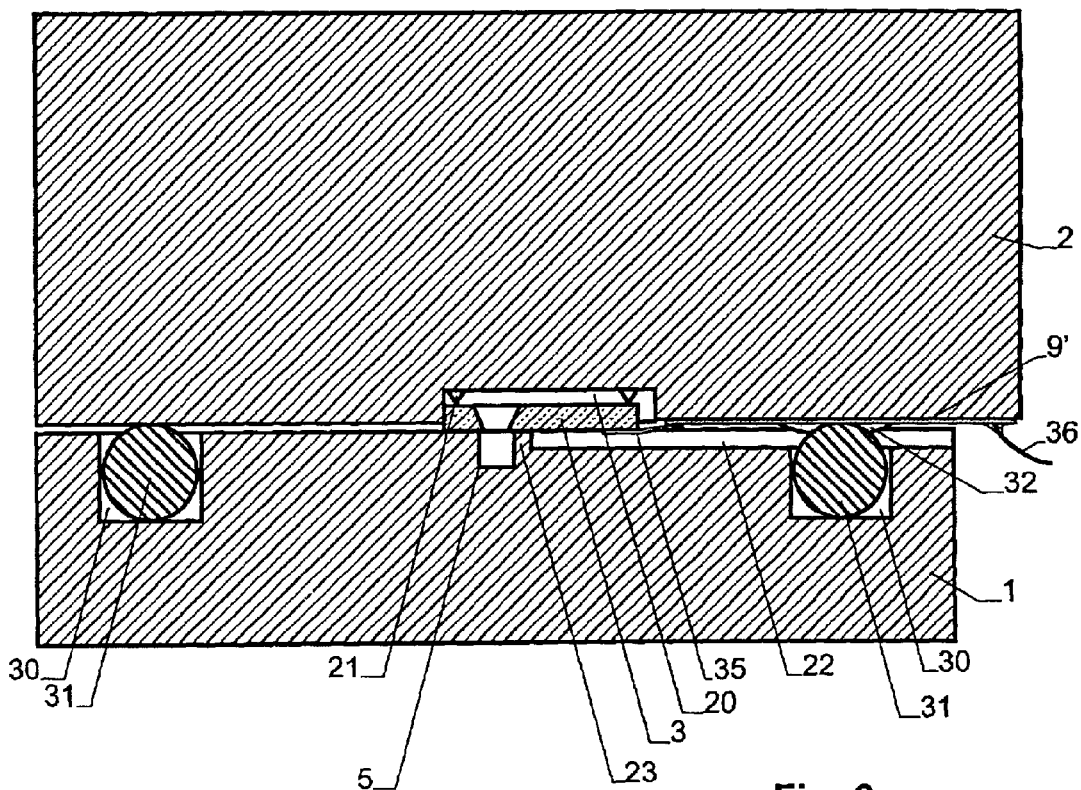
FIG. 6 is a sectional view of a second embodiment of the flow sensor.

A second embodiment of the sensor is shown in FIG. 6, which shows a sectional view corresponding to FIG. 4 of the first embodiment. In the following, only the differences between the first and second embodiment are mentioned.

In the second embodiment, no support foil 9 is used. Rather, the strip conductors 9' are mounted to the inner side of second housing section 2.

In order to avoid electrical connections between the strip conductors, second housing section 2 is made from an electrically isolating material or provided with an isolating coating at its inner side. The strip conductors 9' are strips of metal, e.g. coated galvanically to second housing section 2. Bond wires 35 or other connections can be used for connecting semiconductor chip 3 and strip conductors 9'. Outside the housing the strip conductors 9' form connecting pads 36, which can e.g. be connected to leads or pins.

Figure 7:
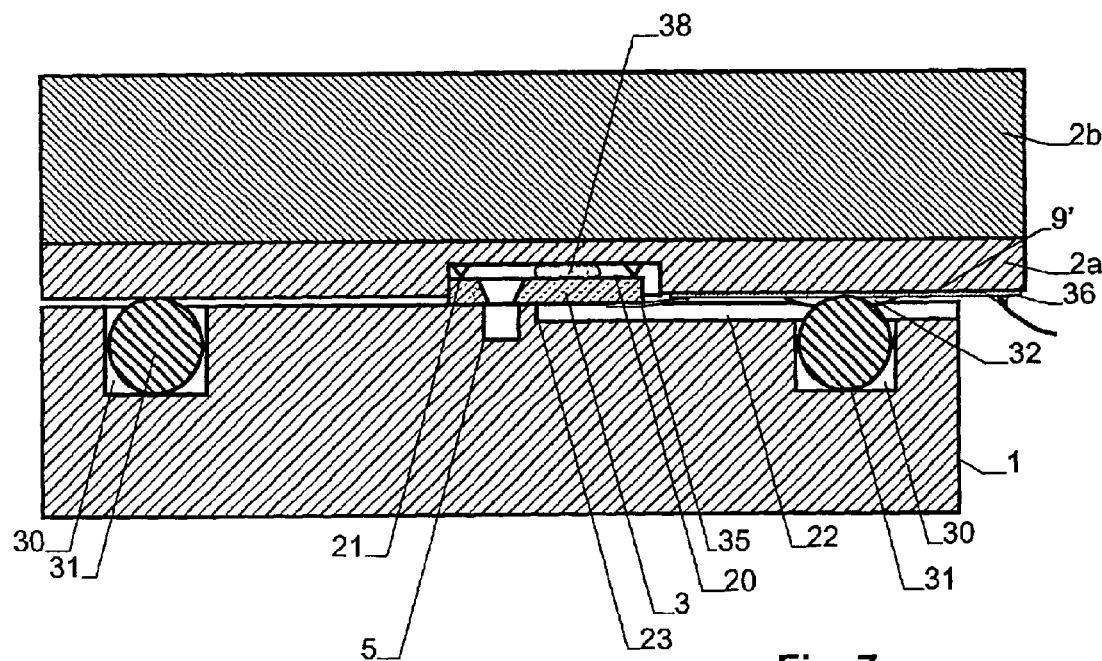
FIG. 7 is a sectional view of a third embodiment of the flow sensor.

A third embodiment of the sensor is shown in FIG. 7, which also shows a sectional view corresponding to FIG. 4 of the first embodiment. Again, only the differences to the first and second embodiment are mentioned.

In this embodiment, the support foil has been replaced by a printed circuit board 2a carrying the strip conductors 9'. The backside of printed circuit board 2a is reinforced by a reinforcing plate 2b. Printed circuit board 2a and reinforcing plate 2b together form second housing section 2. Reinforcing plate 2b forms the support receiving the force of sealing ring 31.

Recess 20 for receiving semiconductor chip 3 is arranged in printed circuit board 2a. Preferably, a glue 38 is used for fixing semiconductor chip 3 to printed circuit board 2a, in such a manner that the backside of membrane 15 is sill communicating with the measuring conduit for preventing a pressure drop of the membrane. Again, bond wires 35 or other connectors are used for connecting semiconductor chip 3 to the strip conductors 9', and the strip conductors form contact pads 36 at the outside of the housing.

Preferably, the strip conductors 9' of the second and third embodiment are as thin as the support foil of the first embodiment and their thickness is less than 100 μm.

Sealing ring 31 is pressed against reinforcing plate 2b, which thereby acts as a support. Printed circuit board 2a extends between sealing ring 31 and reinforcing plate 2b.

Figure 8:
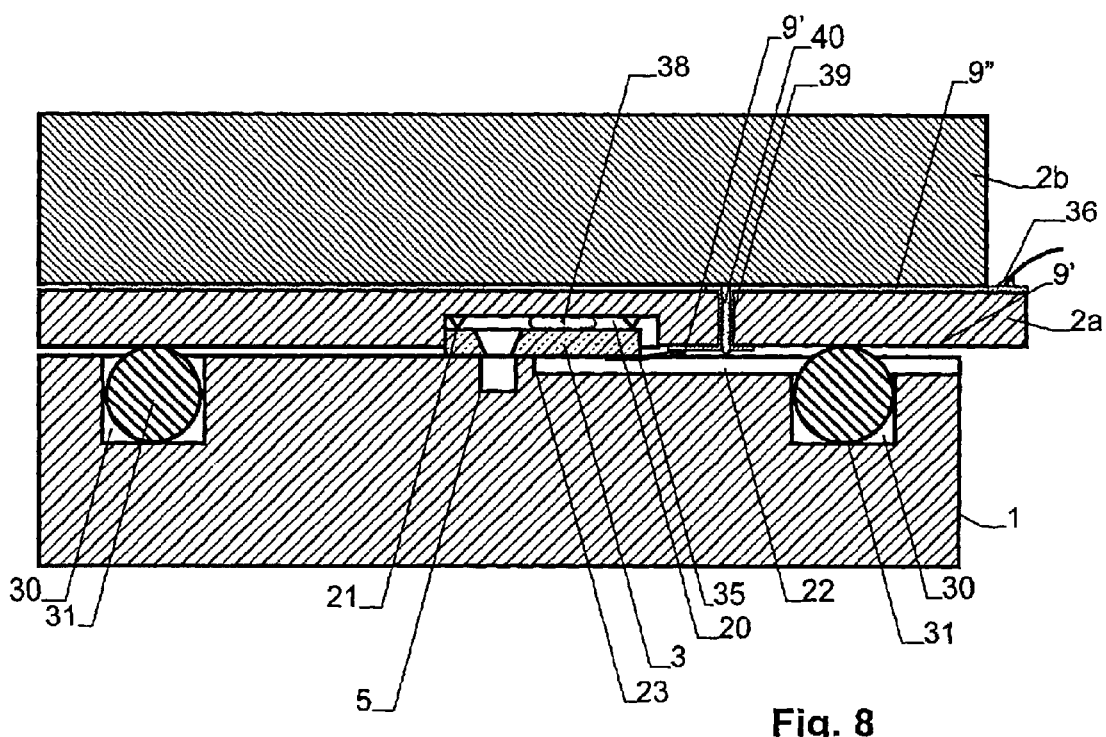
FIG. 8 is a sectional view of a fourth embodiment of the flow sensor.

A fourth embodiment of the sensor is shown in FIG. 8, which also shows a sectional view corresponding to FIG. 4 of the first embodiment. The fourth embodiment corresponds substantially to the third embodiment. The differences are discussed in the following.

In the fourth embodiment, printed circuit board 2a is provided with strip conductors 9' and 9" on both sides. Semiconductor chip 3 is connected, e.g. via bond wires 35, with the strip conductors 9' at the bottom side of printed circuit board 2a. The strip conductors 9' end at feedthroughs 39, where they are connected to the strip conductors 9" at the top side of printed circuit board 2a. The strip conductors 9"

extend between reinforcement plate 2b and sealing ring 31 to the outside of the housing where they form the contact pads 36.

The feedthroughs 39 are filled with a sealant 40 preventing a pressure leak from the measuring conduit.

The sensor described here can easily receive a pressure of more than 25 bar in the measuring conduit. It can be used for measurements of gases and liquids of any type.

While there are shown and described presently preferred embodiments of the invention, it is to be distinctly understood that the invention is not limited thereto but may be otherwise variously embodied and practised within the scope of the following claims.

What is claimed is:

1. A flow sensor comprising
    a housing with at least two housing sections and forming a measuring conduit between at least some of said housing sections,
    a semiconductor chip comprising a sensor element arranged at a wall of the measuring conduit,
    a sealing ring arranged between two of said housing sections and surrounding said semiconductor chip, said sealing ring pressing against a support formed by at least one of said housing sections, wherein said semiconductor chip is completely arranged within an area enclosed by said sealing ring, and
    at least one strip conductor connected to the semiconductor chip and extending from said semiconductor chip between said support and said sealing ring and out of said housing.

2. The flow sensor of claim 1 wherein said sealing ring is pressed against said strip conductor.

3. The flow sensor of claim 1 wherein said strip conductor is arranged on one of said housing sections.

4. The flow sensor of claim 3 further comprising a printed circuit board forming at least part of one of said housing sections, wherein said strip conductor is arranged on said printed circuit board.

5. The flow sensor of claim 4 wherein the printed circuit board is arranged between the sealing ring and the support.

6. The flow sensor of claim 1 further comprising a flexible support foil wherein said strip conductor is arranged on said support foil.

7. The flow sensor of claim 1 wherein said measuring conduit is formed by a groove in a surface of at least one of the housing sections, wherein said sealing ring surrounds said groove, said flow sensor comprising at least two connecting ducts extending through at least one of said housing sections and communicating with said measuring conduit.

8. The flow sensor of claim 7 wherein said sealing ring is arranged at said surface.

9. The flow sensor of claim 7 wherein said sealing ring is arranged in a recess in said surface.

10. The flow sensor of claim 1 wherein said measuring conduit is formed by a groove in a surface of a first housing section,
    and wherein said semiconductor chip is arranged in a recess of a second housing section, is flush with a wall of the measuring conduit, and contacts such said first housing section.

11. The flow sensor of claim 10 wherein said recess has a bottom formed by a recessed surface of said second housing part and wherein the flow sensor comprises at least one spacer between said semiconductor chip and the bottom of said recess, said spacer being deformed by a force exerted by said first housing section on said semiconductor chip.

12. The flow sensor of claim 11 wherein said spacer comprises a plurality of bumps located in said bottom of said recess and comprising tips, said tips being deformed by said force.

13. The flow sensor of claim 12 wherein said bumps are an integral part of said second housing section.

14. The flow sensor of claim 10 wherein said recess comprises a side wall parallel to said measuring conduit, said side wall ending in recessed sections, such that said side wall ending in recessed sections, such that said side wall forms a straight top for positioning the semiconductor chip in a direction perpendicular to said measuring conduit.

15. The flow sensor of claim 1 further comprising a sealant paste arranged at a crossing of said strip conductor and said sealant ring.

16. The flow sensor of claim 1 wherein said semiconductor chip comprises a membrane, wherein said sensor element is arranged at least partially on said membrane, and wherein both sides of said membrane are in contact with said conduit such that a pressure drop over said membrane is substantially zero.

17. The flow sensor of claim 1 wherein said semiconductor chip is arranged closer to an exit end than to an entry end of the measuring conduit.

18. A flow sensor comprising
    a housing with at least two housing sections forming a measuring conduit between at least some of said housing sections, wherein said measuring conduit is formed by a groove in a surface of at least one of the housing sections
    at least two connecting ducts extending through at least one of said housing sections and communicating with said measuring conduit,
    a semiconductor chip comprising a sensor element arranged at a wall of the measuring conduit,
    a sealing ring arranged between two of said housing sections and surrounding said semiconductor chip and said groove, said sealing ring pressing against a support formed by at least one of said housing sections,
    at least one strip conductor connected to the semiconductor chip and extending between said support and said sealing ring and out of said housing, and
    a nose forming part of a wall of said measuring conduit and extending from one of said housing sections against said semiconductor chip, thereby dividing said semiconductor chip in a first part that is in contact with said measuring conduit and a second part that is connected to said strip conductor.

19. A flow sensor comprising
    a housing with at least a first and second housing section and forming a measuring conduit between said housing sections, wherein said measuring conduit is formed by a groove in a surface of at least one of the housing sections, at least two connecting ducts extending through the second housing section and communicating with said measuring conduit, said connecting ducts ending in a surface of said second housing section, wherein said surface is opposite said measuring conduit, a semiconductor chip comprising a sensor element arranged at a wall of the measuring conduit, and a sealing ring arranged between said first and said second housing sections and surrounding said semiconductor chip and said groove, said sealing ring pressing against a support formed by at least one or said housing sections.

20. The flow sensor of claim 19 further comprising at least one strip conductor connected to the semiconductor chip and extending between said support and said sealing ring and out of said housing.

* * * * *